United States Patent
Joshi et al.

(10) Patent No.: US 11,879,686 B2
(45) Date of Patent: Jan. 23, 2024

(54) COOLING SYSTEMS COMPRISING PASSIVELY AND ACTIVELY EXPANDABLE VAPOR CHAMBERS FOR COOLING POWER SEMICONDUCTOR DEVICES

(71) Applicants: Toyota Motor Engineering & Manufacturing North America, Inc., Plano, TX (US); Purdue Research Foundation, West Lafayette, IN (US)

(72) Inventors: Shailesh N. Joshi, Ann Arbor, MI (US); Srivathsan Sudhakar, West Lafayette, IN (US)

(73) Assignees: TOYOTA MOTOR ENGINEERING & MANUFACTURING NORTH AMERICA, INC., Plano, TX (US); PURDUE RESEARCH FOUNDATION, West Lafayette, IN (US)

( * ) Notice: Subject to any disclaimer, the term of this patent is extended or adjusted under 35 U.S.C. 154(b) by 32 days.

(21) Appl. No.: 17/860,507

(22) Filed: Jul. 8, 2022

(65) Prior Publication Data
US 2022/0341668 A1    Oct. 27, 2022

Related U.S. Application Data

(63) Continuation of application No. 16/560,230, filed on Sep. 4, 2019, now Pat. No. 11,415,370.

(51) Int. Cl.
*F28B 1/02* (2006.01)
*F28F 3/02* (2006.01)
(Continued)

(52) U.S. Cl.
CPC ............... *F28B 1/02* (2013.01); *F28F 3/02* (2013.01); *H01L 23/427* (2013.01);
(Continued)

(58) Field of Classification Search
CPC .. F28B 1/02; F28F 3/02; H01L 23/427; F28D 15/0233; F28D 15/025; F28D 15/0266; F28D 15/06
(Continued)

(56) References Cited

U.S. PATENT DOCUMENTS 3,399,717 A    9/1968  Cline
4,000,776 A *  1/1977  Kroebig .................. F28D 15/06
                                                165/274

(Continued)

OTHER PUBLICATIONS

Bosch DAS 1000 calibration set: professional adjustment of sensors and cameras of driver assistance systems (https://www.bosch-presse.de/pressportal/de/en/bosch-das-1000-calibration-set-professional-adjustment-of-sensors-and-cameras-of-driver-assitance-systems-151808.html).

(Continued)

*Primary Examiner* — Joel M Attey
(74) *Attorney, Agent, or Firm* — DINSMORE & SHOHL LLP

(57) ABSTRACT

A cooling system that includes an expandable vapor chamber having a condenser side opposite an evaporator side, a condenser side wick coupled to a condenser side wall, an evaporator side wick coupled to an evaporator side wall, and a vapor core positioned between the evaporator side wick and the condenser side wick. The cooling system also includes a vapor pressure sensor communicatively coupled to a controller and a bellow actuator disposed in the vapor core and communicatively coupled to the controller. The bellow actuator is expandable based on a vapor pressure measurement of the vapor pressure sensor.

16 Claims, 8 Drawing Sheets

(51) Int. Cl.
*H01L 23/427* (2006.01)
*F28D 15/06* (2006.01)
*F28D 15/02* (2006.01)

(52) U.S. Cl.
CPC ........ *F28D 15/025* (2013.01); *F28D 15/0233* (2013.01); *F28D 15/0266* (2013.01); *F28D 15/06* (2013.01)

(58) Field of Classification Search
USPC .................................................... 165/104.21
See application file for complete search history.

(56) References Cited

U.S. PATENT DOCUMENTS

| | | | |
|---|---|---|---|
| 4,297,190 A | 10/1981 | Garrett | |
| 4,951,740 A * | 8/1990 | Peterson | ............... F28D 15/046 165/80.4 |
| 6,608,752 B2 * | 8/2003 | Morris | ................. H01L 23/367 257/E23.09 |
| 8,176,972 B2 | 5/2012 | Mok | |
| 8,270,170 B2 | 9/2012 | Hughes et al. | |
| 2009/0199999 A1 | 8/2009 | Mitic et al. | |
| 2010/0300654 A1 | 12/2010 | Edwards | |
| 2011/0110041 A1 | 5/2011 | Wong | |
| 2012/0170221 A1 * | 7/2012 | Mok | ................... H01L 23/4332 438/122 |
| 2015/0001349 A1 * | 1/2015 | Figus | ..................... F28D 15/04 165/104.26 |
| 2017/0038154 A1 * | 2/2017 | Wang | ................... F28D 15/046 |
| 2019/0045663 A1 | 2/2019 | Shia et al. | |

OTHER PUBLICATIONS

M.D. Volder and D. Reynaerts, "Pneumatic and hydraulic microactuators: a review," J. Micromech. Microeng. vol. 20, No. 4, p. 043001, Mar. 2010.

S. Butefisch, V. Seidemann, and S. buttgenbach, "Novel micropneumatic actuator for MEMS," Sensors and Actuators A: Physical, vol. 97-98, pp. 638-645, Apr. 2002.

C. Moraes, Y. Sun, and C.A. Simmons, "Solving the shrinkage-induced PDMS alignment registration issue in multilayer soft lithography," Journal of Micromechanics and Microengineering, vol. 19, No. 6, p. 065015, Jun. 2009.

C. Oshman, Q. Li, L.-A. Liew, R. Yang, V. M. Bright, and Y. C. Lee, "Flat flexible polymer heat pipes," Journal of Micromechanics and Microengineering, vol. 23, No. 1, p. 015001, Jan. 2013.

* cited by examiner

COOLING SYSTEMS COMPRISING PASSIVELY AND ACTIVELY EXPANDABLE VAPOR CHAMBERS FOR COOLING POWER SEMICONDUCTOR DEVICES

CROSS-REFERENCE TO RELATED APPLICATIONS

The present application is a continuation of U.S. patent application Ser. No. 16/560,230 filed on Sep. 4, 2019, the contents of which are incorporated by reference in its entirety.

TECHNICAL FIELD

The present specification generally relates to vapor chambers for use in a cooling system and, more specifically, to expandable vapor chamber configured to expand passively or actively.

BACKGROUND

A vapor chamber device is a cooling device that includes porous wicking surfaces and a vapor core and houses a cooling fluid. A heat source is applied to an evaporator side of the vapor chamber and a heat sink is applied to a condenser side of the vapor chamber. Heat from the heat source causes the cooling fluid to change from a liquid to a gas at the evaporator side and then the heated gas travels from the evaporator side to the condenser side, where it condenses back to a liquid. Often, vapor chambers experience dryout, which is a condition where the condensed liquid cannot be returned quickly enough to the evaporator side of the vapor chamber, which causes the vapor chamber device to fail and cause the heat source, such as a power semiconductor device, to overheat, damaging the heat source. Thin vapor chamber devices are often susceptible to dryout. However, thin, small form factor vapor chamber devices are desirable in view of space constraints and miniaturization of current and future electronics.

Accordingly, a need exists for alternative vapor chamber devices capable of achieving a small form factor while minimizing the potential for dryout.

SUMMARY

In one embodiment, a cooling system includes an expandable vapor chamber having a condenser side opposite an evaporator side, a condenser side wick coupled to a condenser side wall, an evaporator side wick coupled to an evaporator side wall, and a vapor core positioned between the evaporator side wick and the condenser side wick. The cooling system also includes a vapor pressure sensor communicatively coupled to a controller and a bellow actuator disposed in the vapor core and communicatively coupled to the controller. The bellow actuator is expandable based on a vapor pressure measurement of the vapor pressure sensor.

In another embodiment, a method of cooling a heat generating device includes generating heat using the heat generating device thermally coupled to an evaporator side wall of an expandable vapor chamber. The expandable vapor chamber includes a condenser side opposite an evaporator side, a condenser side wick coupled to a condenser side wall, an evaporator side wick coupled to the evaporator side wall, and a vapor core positioned between the evaporator side wick and the condenser side wick. The bellow actuator is disposed in the vapor core and is communicatively coupled to a controller, the vapor core houses a cooling fluid, and heat generated by the heat generating device evaporates the cooling fluid. The method also includes measuring the vapor pressure in the vapor core using a vapor pressure sensor communicatively coupled to the controller and providing a control signal from the controller to the bellow actuator based on an increased vapor pressure signal measurement of the vapor pressure sensor, thereby expanding the bellow actuator and increasing a volume of the vapor core.

In yet another embodiment, a cooling system includes an expandable vapor chamber having a condenser side opposite an evaporator side, a condenser side wick coupled to a condenser side wall, an evaporator side wick coupled to an evaporator side wall, and a vapor core positioned between the evaporator side wick and the condenser side wick. The condenser side wall includes a thermal shape-memory polymer having a transition temperature such that when the thermal shape-memory polymer is a temperature below the transition temperature, the condenser side wall is in a retracted position and the vapor core is a first volume and when the thermal shape-memory polymer is a temperature above the transition temperature, the condenser side wall is in an expanded position and the vapor core is a second volume that is greater than the first volume.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1A:
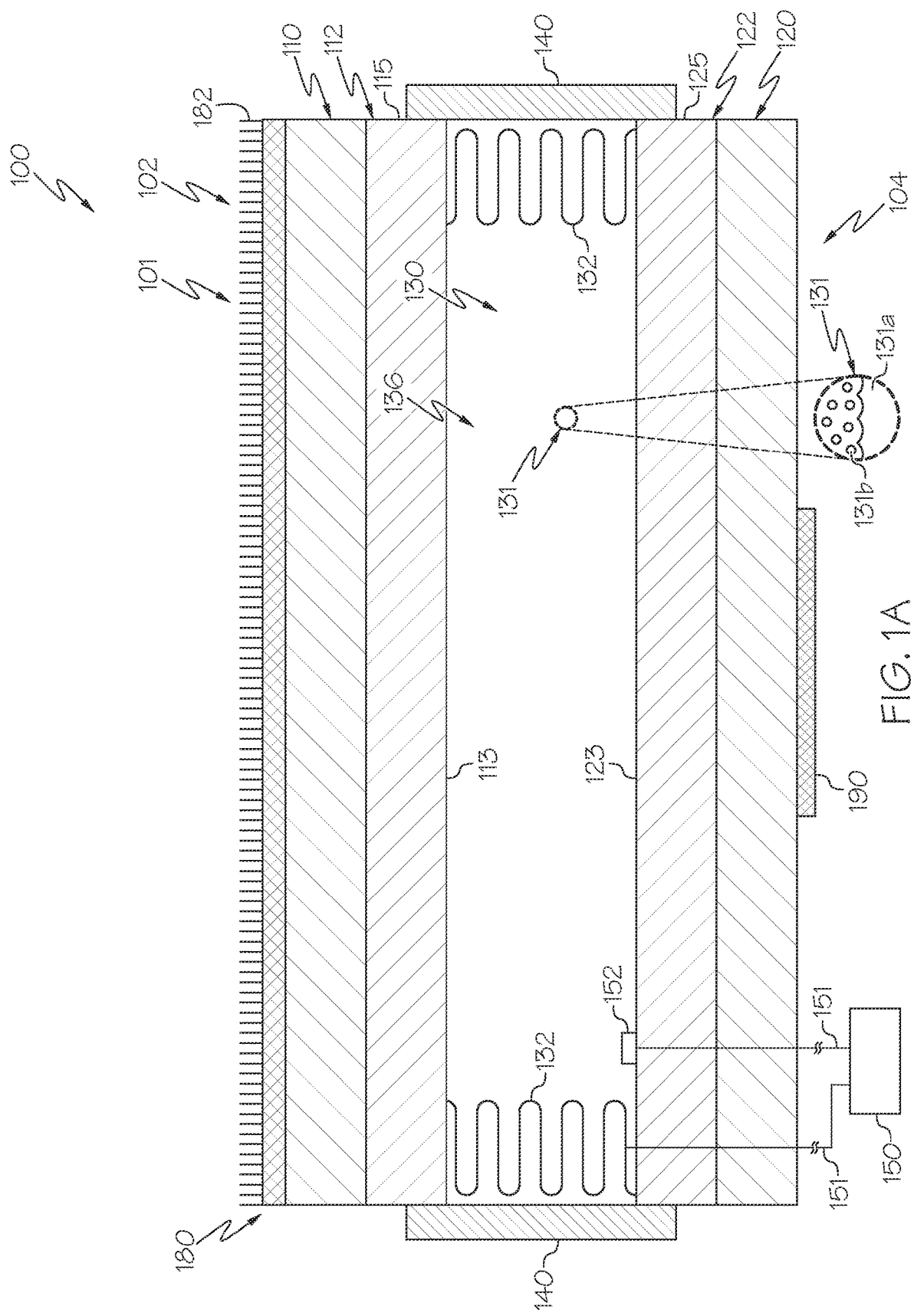
FIG. 1A schematically depicts an example embodiment of a cooling system including an expandable vapor chamber comprising a bellow actuator positioned in a vapor core, where the vapor core is in a retracted state, according to one or more embodiments shown and described herein.

Referring generally to the figures, embodiments of the present disclosure are directed to cooling systems that include an expandable vapor chamber for cooling heat generating devices, such as power semiconductor devices. The expandable vapor chamber includes an evaporator side wick coupled to an evaporator side wall, a condenser side wick coupled to a condenser side wick, and a vapor core disposed between the condenser side wick and the evaporator side wick and hermetically sealed by a sealing layer comprising a flexible material. The vapor core houses a cooling fluid, which is used to remove heat from a semiconductor device. When vapor chambers are used to cool power semiconductor devices, it is advantageous for vapor chambers to have a small thickness to minimize the footprint of the vapor chamber. However, reducing the thickness of a vapor chamber, and thereby reducing the thickness of the vapor core, increases the likelihood of dryout in the vapor core, particularly when the vapor core is under a large thermal load, which may cause the power semiconductor device to overheat.

Accordingly, the vapor core of the expandable vapor chambers described herein may be passively or actively expanded and retracted, for example, based on the vapor pressure in the vapor core, to temporarily increase the thickness and volume of the vapor core. In some embodiments, a bellow actuator is disposed in the vapor core to actively expand and retract the vapor core based on vapor pressure measurements performed by a vapor pressure sensor. In other embodiments, the condenser side wall comprises a thermal shape-memory polymer that changes its shape to increase or decrease the volume of the vapor core based on the temperature of the thermal shape-memory polymer. Embodiments of expandable vapor chambers and cooling systems comprising expandable vapor chambers will now be described and, whenever possible, the same reference numerals will be used throughout the drawings to refer to the same or like parts.

Referring now to FIGS. 1A-2B, a cooling system 100 comprising an expandable vapor chamber 101, 101' positioned between and thermally coupled to a heat generating device 190, such as a power semiconductor device, and a heat removal device 180 is schematically depicted. The expandable vapor chamber 101, 101' comprises a condenser side 102 opposite an evaporator side 104. At the condenser side 102, the expandable vapor chamber 101, 101' comprises a condenser side wick 112 coupled to a condenser side wall 110, 110' and at the evaporator side 104, the expandable vapor chamber 101 comprises an evaporator side wick 122 coupled to an evaporator side wall 120, 120'. In some embodiments, the condenser side wall 110, 110' and the evaporator side wall 120, 120' each comprise copper, however, other materials, such as other metal materials, are contemplated.

The heat removal device 180, which may comprise a heat plate having an array of fins 182, is thermally coupled to the condenser side wall 110, 110'. The heat removal device 180 may be directly coupled to the condenser side wall 110, 110' or additional intervening components may be positioned between the condenser side wall 110, 110' and the heat removal device 180, for example, to help facilitate heat transfer from the expandable vapor chamber 101, 101' to the heat removal device 180. The heat generating device 190 is thermally coupled to the evaporator side wall 120, 120'. The heat generating device 190 may be directly coupled to the evaporator side wall 120, 120' or additional intervening components may be positioned between the evaporator side wall 120, 120' and the heat generating device 190, for example, to help facilitate heat transfer from the heat generating device 190 to the expandable vapor chamber 101, 101'.

In some embodiments, the heat generating device 190 is a power semiconductor device. Non-limiting examples of power semiconductor devices that may be cooled by the cooling system 100 described herein include, but are not limited to, SiC semiconductors, GaN semiconductors, or other types of semiconductor devices that provide large bandgaps, high breakdown voltages, and high thermal conductivity. Power semiconductor devices may be capable of greater capacity in particular aspects than other semiconductor devices, such as higher blocking voltages, higher switching frequencies, and higher junction temperatures. Consequently, they may also require greater cooling capacity. Implementations of power semiconductors may include, but are not limited to, bipolar junction transistors (BJTs), insulated-gate bipolar transistors (IGBTs), and power metal-oxide-semiconductor field-effect transistors (MOSFETs). Power semiconductors may be used as power supplies, for example, as the power supply for an electric vehicle.

As depicted in FIGS. 1A-2B, the expandable vapor chamber 101, 101' further comprises a vapor core 130 positioned between the evaporator side wick 122 and the condenser side wick 112. The vapor core 130 houses a cooling fluid 131. The evaporator side wick 122 and the condenser side wick 112 each comprise a wicking surface 113, 123 that faces the vapor core 130 and defines the boundaries of at least a portion of the vapor core 130. In some embodiments, the evaporator side wick 122 and the condenser side wick 112 may comprise a layer of particles sintered onto the condenser side wall 110, 110' and the evaporator side wall 120, 120', for example, copper particles or silica particles. In other embodiments, the evaporator side wick 122 and the condenser side wick 112 comprise a mesh layer, such as a mesh copper, which may be pressed onto the condenser side wall 110, 110' and the evaporator side wall 120, 120', or coupled to the condenser side wall 110, 110', and the evaporator side wall 120, 120' using another method, such as additive manufacturing. The condenser side wick 112 and the evaporator side wick 122 are each porous structures and each wicking surface 113, 123 comprises a plurality of nucleation sites, which help induce a phase change of the cooling fluid 131. For example, the nucleation sites of the wicking surfaces 113, 123 may enhance boiling of the cooling fluid 131.

Figure 1B:
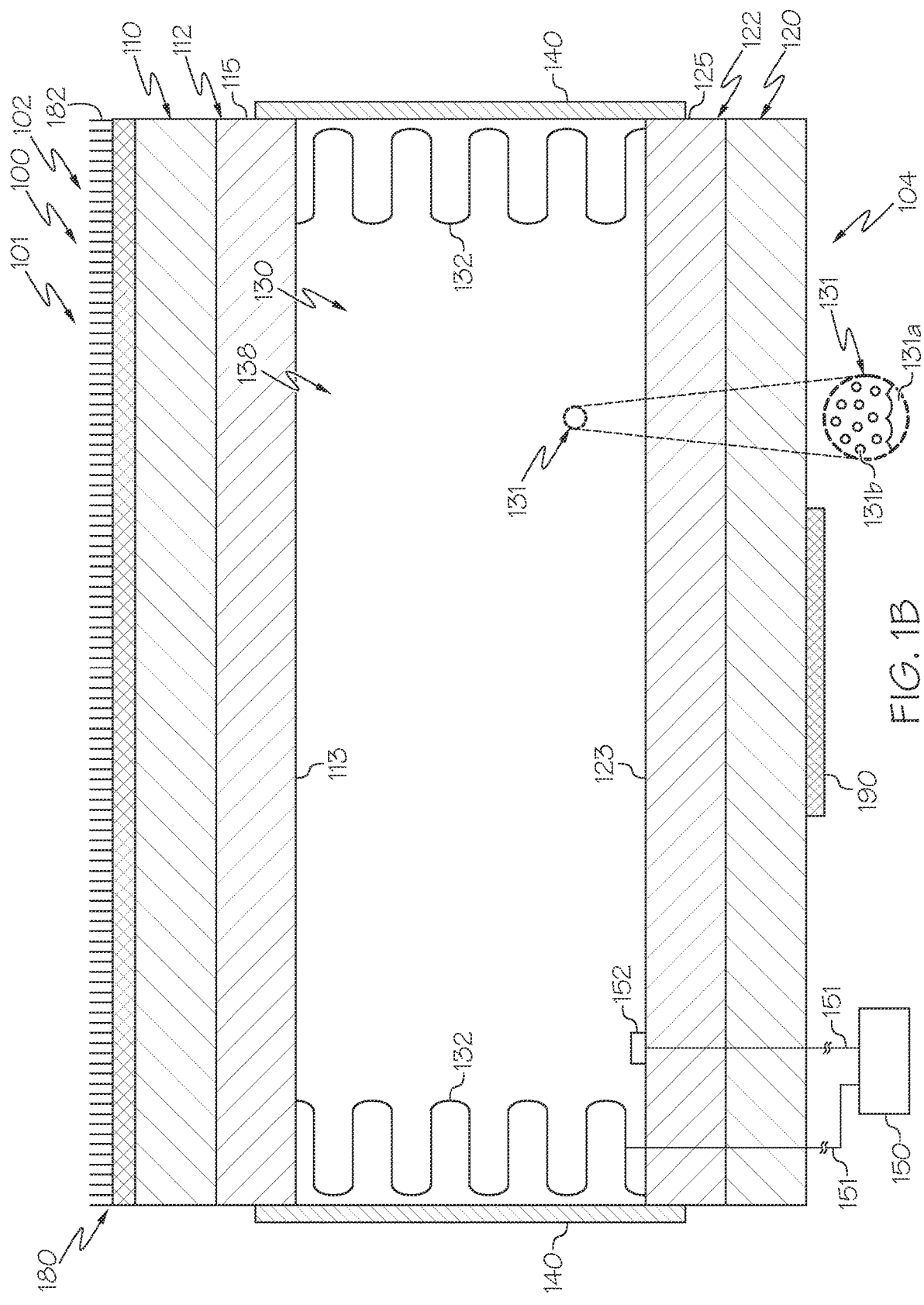
FIG. 1B schematically depicts the example cooling system of FIG. 1A in which the expandable vapor chamber comprising the bellow actuator positioned in the vapor core, where the vapor core is in an expanded state, according to one or more embodiments shown and described herein.

The expandable vapor chamber 101, 101' further comprises a sealing layer 140 comprising a flexible material that hermetically seals the vapor core 130. In particular, the sealing layer 140 may be coupled to the evaporator side wall 120, 120', the evaporator side wick 122, or both, as well as the condenser side wall 110, 110', the condenser side wick 112, or both, to hermetically seal the vapor core 130. In some embodiments, as depicted in FIGS. 1A and 1B, the sealing layer 140 extends between the evaporator side wick 122 and the condenser side wick 112 and the sealing layer 140 is coupled to a side surface 125 of the evaporator side wick 122 and a side surface 115 of the condenser side wick 112. Furthermore, while the sealing layer 140 is not depicted in contact with the evaporator side wall 120 and the condenser side wall 110 in FIGS. 1A and 1B, it should be understood that, in some embodiments, the sealing layer 140 may extend to the evaporator side wall 120 and the condenser side wall 110, and may be coupled to the evaporator side wall 120 and the condenser side wall 110.

Figure 2A:
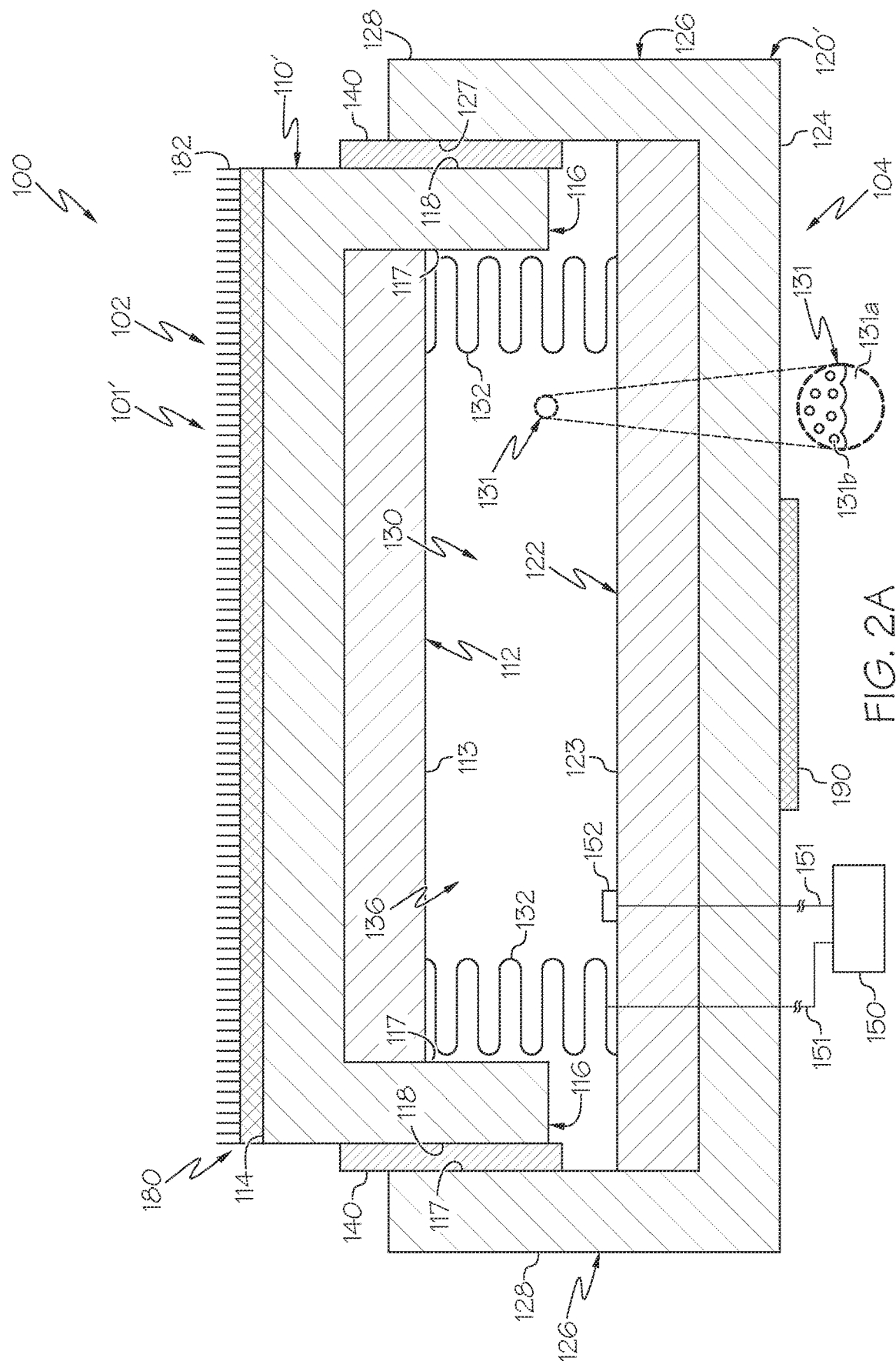
FIG. 2A schematically depicts another example embodiment of a cooling system including an expandable vapor chamber comprising a bellow actuator positioned in a vapor core, where the vapor core is in a retracted state, according to one or more embodiments shown and described herein.
Figure 2B:
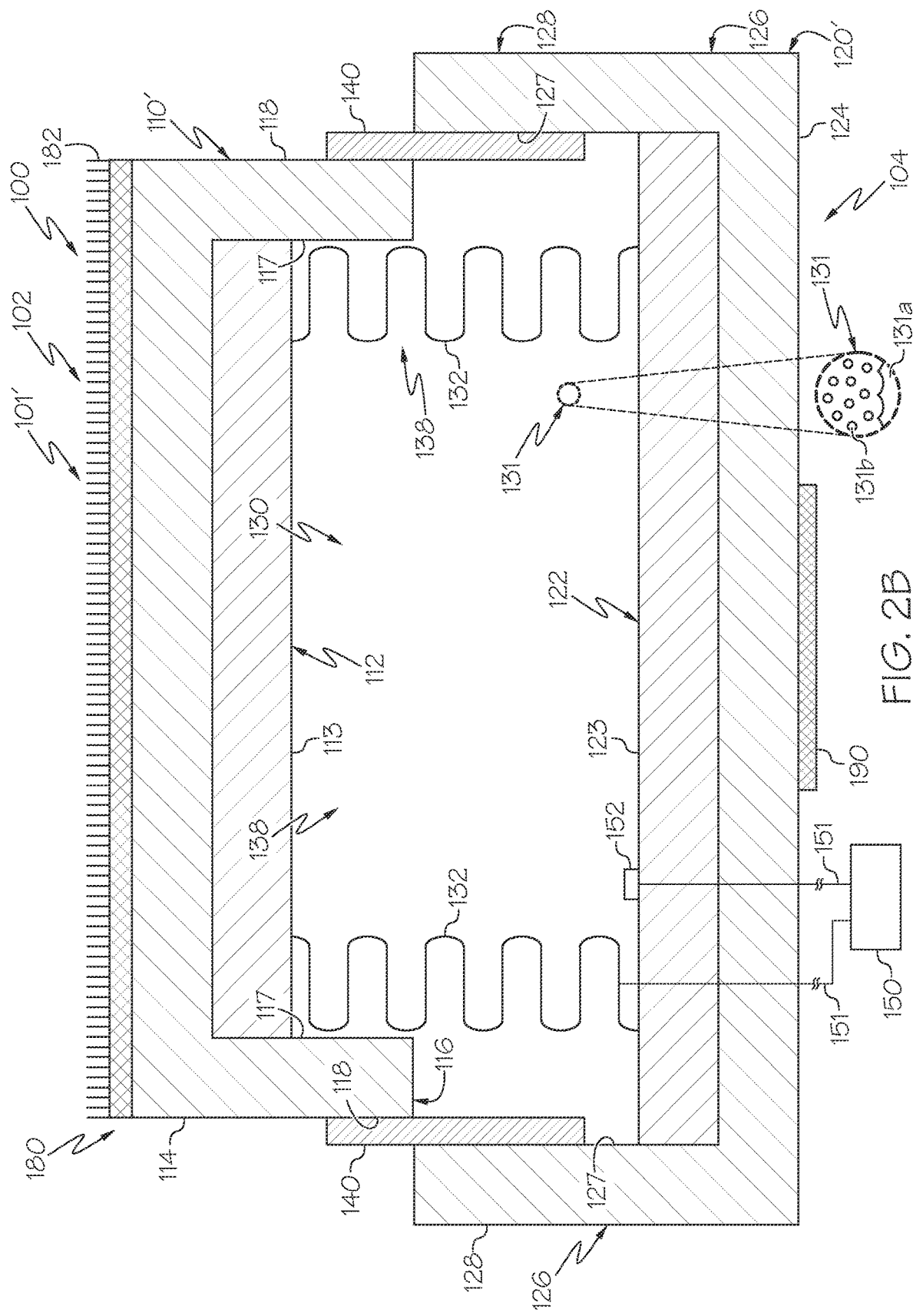
FIG. 2B schematically depicts the example cooling system of FIG. 2A in which the expandable vapor chamber comprising the bellow actuator positioned in the vapor core, where the vapor core is in an expanded state, according to one or more embodiments shown and described herein.

Referring now to FIGS. 2A and 2B, the expandable vapor chamber 101' is schematically depicted. The expandable vapor chamber 101' is similar to the expandable vapor chamber 101 of FIGS. 1A and 1B, and comprises an evaporator side wall 120' and a condenser side wall 110'. The evaporator side wall 120' and the condenser side wall 110' of the expandable vapor chamber 101' each include an end portion 114, 124, and shoulder portions 116, 126. The shoulder portions 126 of the evaporator side wall 120' extend outward from the end portion 124 of the evaporator side wall 120' toward the condenser side 102 of the expandable vapor chamber 101' and each comprise an inner shoulder surface 127 opposite an outer shoulder surface 128. Similarly, the shoulder portions of 116 of the condenser side wall 110' extend outward from the end portion 114 of the condenser side wall 110' toward the evaporator side 104 of the expandable vapor chamber 101' and each comprise an inner shoulder surface 117 opposite an outer shoulder surface 118.

As shown in FIGS. 2A and 2B, the evaporator side wick 122 is positioned between the shoulder portions 126 of the evaporator side wall 120' and the condenser side wick 112 is positioned between the shoulder portions 116 of the condenser side wall 110'. Furthermore, the sealing layer 140 of the expandable vapor chamber 101' is coupled to the shoulder portions 116 of the condenser side wall 110 and the shoulder portions 126 of the evaporator side wall 120. Thus, the condenser side 102 of the expandable vapor chamber 101' may be coupled to the evaporator side 104 of the expandable vapor chamber 101' without directly coupling the sealing layer 140 to the evaporator side wick 122 or the condenser side wick 112. Moreover, in some embodiments, such as the embodiment depicted in FIGS. 2A and 2B, the shoulder portion 126 of the evaporator side wall 120 and the shoulder portion 116 of the condenser side wall 110 may extend adjacent one another in an offset, overlapping arrangement and the sealing layer 140 may be disposed between the shoulder portions 116, 126 of the evaporator side wall 120 and the condenser side wall 110. For example, in some embodiments, such as the embodiment depicted in FIGS. 2A and 2B, the sealing layer 140 is coupled to the inner shoulder surfaces 127 of the evaporator side wall 120' and the outer shoulder surfaces 118 of the condenser side wall 110'. However, it should be understood that, in other embodiments, the sealing layer 140 may be coupled to the inner shoulder surfaces 117 of the condenser side wall 110' and the outer shoulder surfaces 128 of the evaporator side wall 120'.

Referring again to FIGS. 1A-2B, the cooling fluid 131 housed within the vapor core 130 may comprise deionized water. Other exemplary cooling fluids include, without limitation, water, organic solvents, and inorganic solvents. Examples of such solvents may include commercial refrigerants such as R-134a, R717, and R744. Moreover, in some embodiments, the cooling fluid 131 may be a dielectric cooling fluid. Non-limiting dielectric cooling fluids other than deionized water include R-245fa and HFE-7100. The type of cooling fluid 131 chosen may depend on the operating temperature of the heat generating device 190 to be cooled. Further, selection of the composition of the cooling fluid 131 may be based on, among other properties, the boiling point, the density, and/or the viscosity of the cooling fluid 131.

In operation, the cooling fluid 131 is used for heat transfer, for example, to remove heat from the heat generating device 190 and transfer this heat to the heat removal device 180. In particular, heat generated by the heat generating device 190 generates heat is transferred through the evaporator side wall 120, 120' and the evaporator side wick 122 to the cooling fluid 131 in the vapor core 130. As the temperature of portions of the cooling fluid 131 increase, these heated portions of the cooling fluid 131 may transform from a liquid phase 131a to a gas phase 131b, for example, at the plurality of nucleation sites of the wicking surface 123 of the evaporator side wick 122. Furthermore, heat may be removed from the cooling fluid 131, for example, by heat transfer through the condenser side wick 112 and the condenser side wall 110 to the heat removal device 180. As the temperature of portions of the cooling fluid 131 decrease, these cooled portions of the cooling fluid 131 may transform from the gas phase 131b to the liquid phase 131a, for example, at the plurality of nucleation sites of the wicking surface 113 of the condenser side wick 112. Cooling fluid 131 that transforms back into the liquid phase 131a may then return to the evaporator side 104 of the expandable vapor chamber 101, 101'.

When the amount of the cooling fluid 131 in the gas phase 131b increases, the vapor pressure in the vapor core 130 increases. While not intending to be limited by theory, increasing vapor pressure in the vapor core 130 may cause dryout in the vapor core 130, particularly when the vapor core 130 is thin. Dryout is a condition wherein the condensed liquid (i.e., the cooling fluid 131 that transforms from the gas phase 131b back into the liquid phase 131a at the condenser side wick 112) is not returned quickly enough to the evaporator side wick 122, causing the evaporator side wick 122 to dry, which may cause the expandable vapor chamber 101, 101' to fail and may damage the device the vapor chamber is supposed to be cooling (e.g., the heat generating device 190). While still not intending to be limited by theory, dryout is influenced by the pressure drop $\Delta P_{total}$ within a vapor chamber. The pressure drop of individual components within a vapor chamber can be calculated by one-dimensional approximations to govern momentum equations for liquid and vapor flow. The total pressure drop is $\Delta P_{total}$, where $\Delta P_{total} = \Delta P_l + \Delta P_v$, $\Delta P_l$ is the change in vapor pressure at the evaporator side of the vapor core (e.g., at the evaporator side wick 122) and $\Delta P_v$ is the change in vapor pressure at the center of the vapor core (e.g., at the center of the vapor core 130). The total pressure drop $\Delta P_{total}$ corresponds with the dryout limit of a vapor chamber such that, at the dryout limit, $\Delta P_{total} = \Delta P_c$, where $\Delta P_c$ is the capillary pressure of the vapor chamber. In other words, when the pressure drop ratio $\Delta P_{total}/\Delta P_c \geq 1$, the dryout limit of the vapor chamber is reached. Without intending to be limited by theory, thin vapor chambers are susceptible to large pressure drop ratios.

Figure 3:
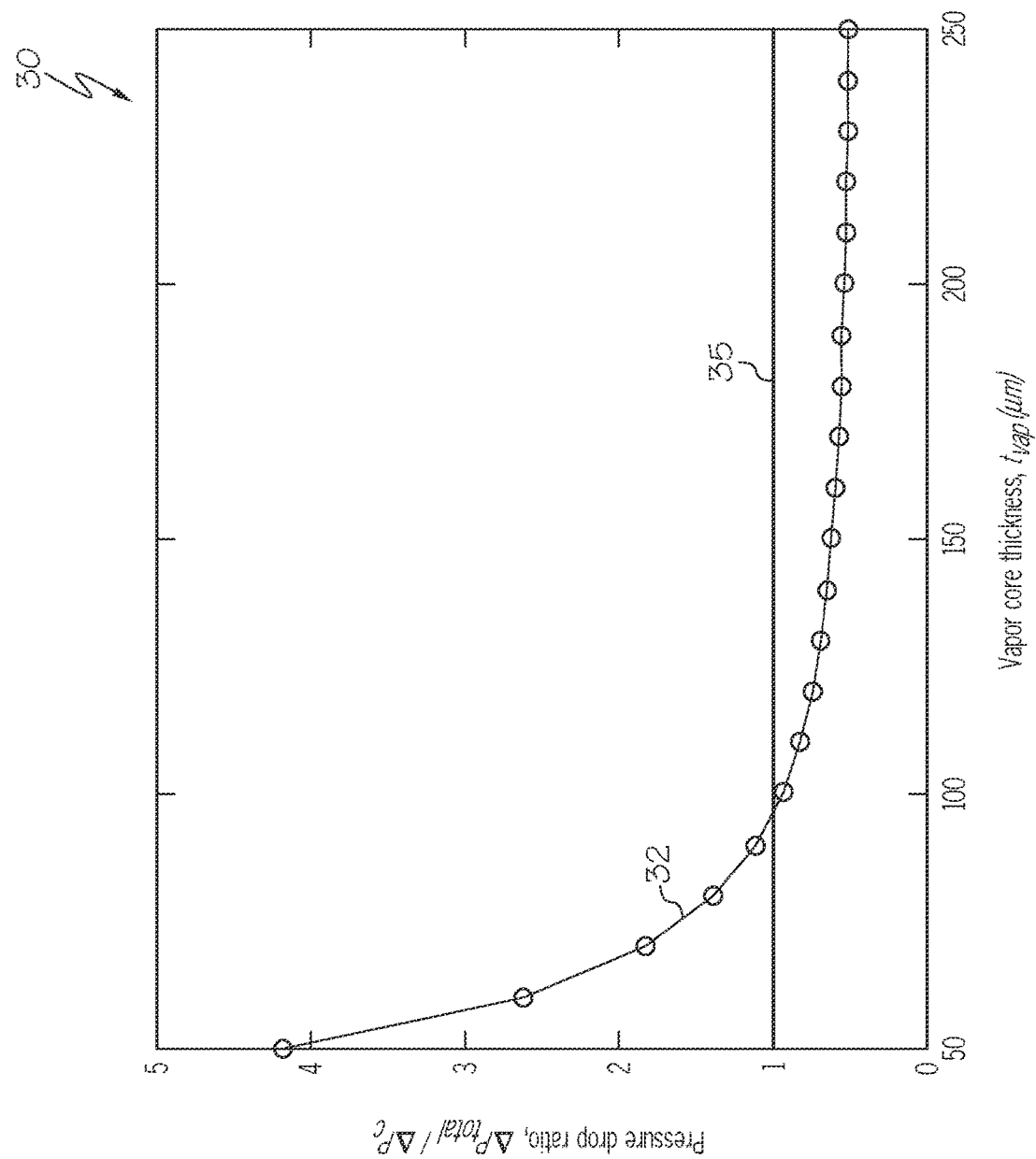
FIG. 3 graphically depicts pressure drop ratio in a vapor core as a function of the thickness of the vapor core, according to one or more embodiments shown and described herein.

Referring now to FIG. 3, graph 30 shows the pressure drop ratio in an example vapor core of an example vapor chamber, as a function of the thickness of the example vapor core. In graph 30, the example vapor chamber is removing heat from a heat generating device operating at 100 Watts (W). Line 22 shows that the pressure drop ratio reduces as the thickness of the vapor core increases. In addition, line 25 shows the dryout limit of the vapor chamber, which is when the pressure drop ratio $\Delta P_{total}/\Delta P_c=1$. As shown in FIG. 3, increasing the thickness of the example vapor reduces the pressure drop ratio. In particular, when the example vapor chamber comprises a vapor core with a thickness greater than 100 µm, the example vapor core may remove heat from a heat generating device operating at 100 W without undergoing dryout.

Figure 4:
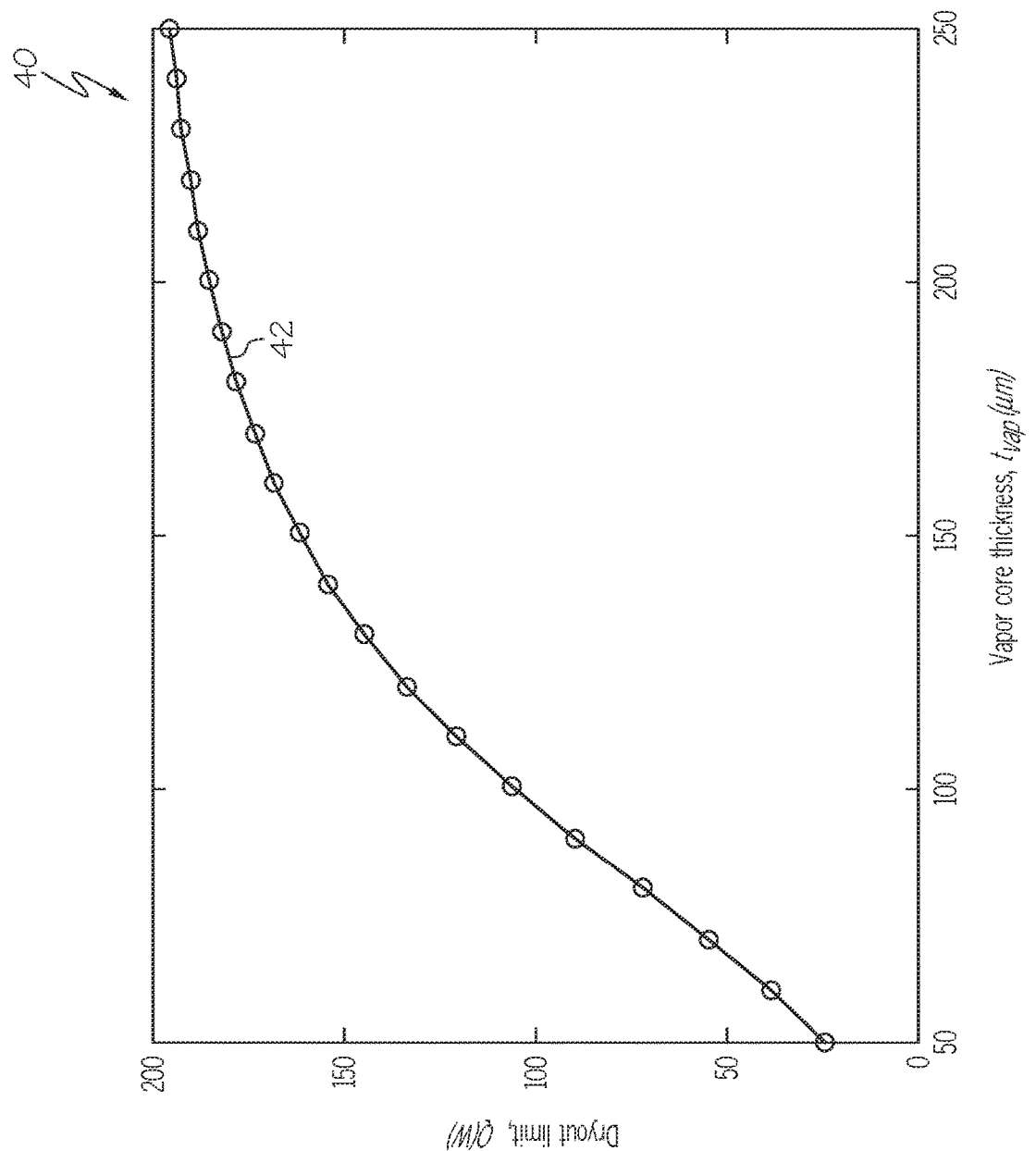
FIG. 4 graphically depicts dryout limit in a vapor core as a function of the thickness of the vapor core, according to one or more embodiments shown and described herein.

Referring now to FIG. 4, graph 40 illustrates the effect of vapor core thickness on dryout limit. In particular, the x-axis of the graph 40 is the thickness of the vapor core and the y-axis of graph 40 shows the operating power Q(W) of an example heat generating device. Line 42 of graph 40 depicts that the operating power at which the dryout limit of the example vapor chamber is reached as a function of the vapor core thickness. As shown in FIG. 4, increasing the thickness of the vapor core increases dryout limit of the vapor chamber. However, it is often advantageous for vapor chambers to have a small thickness to minimize the footprint of the vapor chamber and meet space constraints. Thus, the embodiments described herein include expandable vapor chambers 101 (FIGS. 1A and 1B), 101' (FIGS. 2A and 2B), 201 (FIGS. 5A and 5B) in which the vapor core 130 (FIGS. 1A-2B), 230 (FIGS. 5A and 5B) has a variable thickness and volume. Moreover, a vapor core having a variable thickness and volume offers additional advantages, such as, resiliency against packaging stress and power bursts. For example, at high continuous operating power or transient operating spikes, the vapor chamber can buckle due to high internal pressure. In these instances, a pressure based actuation to increase the vapor core thickness can sustain vapor chamber operation during intermittent or continuous power increases, such as power bursts.

Referring again to FIGS. 1A-2B, the expandable vapor chamber 101, 101' comprises a bellow actuator 132 positioned in the vapor core 130 and extending between the condenser side wick 112 and the evaporator side wick 122. In operation, the bellow actuator 132 may expand and retract the vapor core 130, providing the vapor core 130 with volume and thickness variability. In some embodiments, as depicted in FIGS. 1A-2B, the bellow actuator 132 may be coupled to the condenser side wick 112 and the evaporator side wick 122. However, in other embodiments, the bellow actuator 132 may be coupled to the condenser side wall 110 and the evaporator side wall 120, 120'. The bellow actuator 132 may comprises a flexible polymer.

Referring still to FIGS. 1A-2B, the cooling system 100 further comprises a controller 150 communicatively coupled to both a vapor pressure sensor 152 and the bellow actuator 132, for example, via one or more communications pathways 151. The vapor pressure sensor 152 may comprise any sensor configured to measure the vapor pressure in the vapor core 130. The one or more communications pathways 151 may comprise wired or wireless signal pathways. In operation, the vapor pressure sensor 152 may perform a vapor pressure measurement and provide this vapor pressure measurement to the controller 150. Further, the controller 150 may provide control signals to the bellow actuator 132 to expand or contract the bellow actuator 132. Expanding the bellow actuator 132 expands the vapor core 130, increasing the volume of the vapor core 130 and increasing the thickness of the expandable vapor chamber 101, 101'. Contracting the bellow actuator 132 contracts the vapor core 130, reducing the volume of the vapor core 130 and reducing the thickness of the expandable vapor chamber 101, 101'. As described in more detail below, the particular control signal that is sent by the controller 150 to the bellow actuator 132 is based on the vapor pressure measurement of the vapor pressure sensor 152 to expand the bellow actuator 132, thereby increasing the volume of the vapor core 130, when vapor pressure increases or to contract the bellow actuator 132, thereby reducing the volume of the vapor core 130, when the vapor pressure reduces.

Referring still to FIGS. 1A-2B, a method of cooling the heat generating device 190 using the expandable vapor chamber 101, 101' first includes generating heat using the heat generating device 190, for example, by operating the heat generating device 190. As noted above, the heat generating device 190 is thermally coupled to the evaporator side wall 120, 120' of the expandable vapor chamber 101, 101'. In operation, heat generated by the heat generating device 190 is transferred to the cooling fluid 131, which evaporates a portion of the cooling fluid 131 (i.e., transforming a portion of the cooling fluid from the liquid phase 131*a* to the gas phase 131*b*), thereby increasing the vapor pressure in the vapor core 130. For example, heat generated by the heat generating device 190 evaporates the cooling fluid 131 at the plurality of nucleation sites of the evaporator side wick 122. As the heat generated by the heat generating device 190 is transferred to the cooling fluid 131, the vapor pressure sensor 152 measures the vapor pressure in the vapor core 130 and provides continuous or intermittent vapor pressure measurements to the controller 150.

Next, the method comprises providing a control signal from the controller 150 to the bellow actuator 132 based on the vapor pressure measurements of the vapor pressure sensor 152. In particular, as the vapor pressure sensor 152 measures an increased vapor pressure in the vapor core 130 due to a phase change of portions of the cooling fluid 131 from the liquid phase 131*a* to the gas phase 131*b*, the control signal instructs the bellow actuator 132 to expand, increasing the volume of the vapor core 130. For example, FIGS. 1A and 2A depict the vapor core 130 in a retracted position 136 and FIGS. 1B and 2B depict the vapor core 130 in the expanded position 138. Indeed, a larger portion of the cooling fluid 131 is in the liquid phase 131*a* when the vapor core 130 is in the retracted position 136 than when the vapor core 130 is in the expanded position 138. Furthermore, the vapor core 130 comprises a minimum volume and thickness when the vapor core 130 is in the retracted position 136 (FIG. 1A, 2A) and the vapor core 130 comprises a maximum volume and thickness when the vapor core 130 is in the expanded position 138 (FIGS. 1B, 2B). However, while the retracted position 136 and the expanded position 138 of the vapor core 130 are depicted, it should be understood that the bellow actuator 132 may expand and retract the vapor core 130 to any position between the retracted position 136 and the expanded position 138, for example, based on the vapor pressure measurement.

Referring still to FIGS. 1A-2B, the method of cooling the heat generating device 190 further comprises removing heat from the vapor core 130 using the heat removal device 180. In particular, removing heat from the cooling fluid 131 housed in the vapor core 130 condenses a portion of the cooling fluid 131 from the gas phase 131*b* to the liquid phase 131*a*, for example, at the plurality of nucleation sites of the condenser side wick 112 of the expandable vapor chamber 101, 101'. As heat is removed from the cooling fluid 131, a portion of the cooling fluid 131 transforms from the gas phase 131b to the liquid phase 131a, increasing the amount of the cooling fluid 131 that is in the liquid phase 131a and reducing the vapor pressure in the vapor core 130. Further, as the vapor pressure in the vapor core 130 lowers, the controller 150 provides a control signal to the bellow actuator 132 based on a decreased vapor pressure signal measurement of the vapor pressure sensor 152, thereby contracting the or more bellow actuators 132 and reducing the volume of the vapor core 130 and reducing the thickness of the expandable vapor chamber 101, 101'. In operation, the heat generating device 190 may operate at a continuous temperature such that the vapor core 130 is maintained at static position beyond the retracted position 136, for example, between the retracted position 136 and the expanded position 138 or in the expanded position 138. Moreover, the heat generating device 190 may operate at a variable temperature such that the vapor core 130 varies at or between the contracted position and the expanded position 138.

Figure 5A:
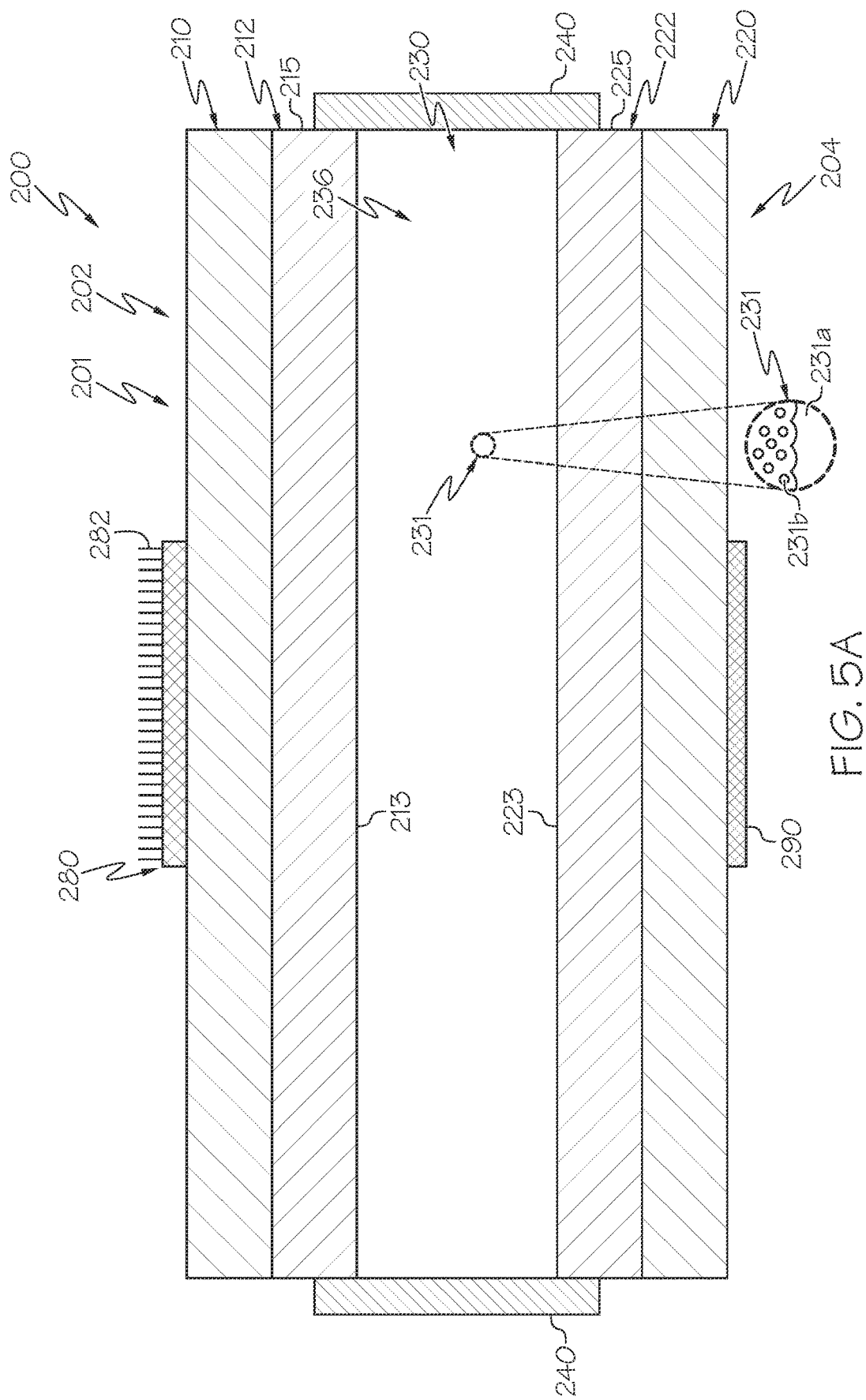
FIG. 5A schematically depicts an example embodiment of a cooling system including an expandable vapor chamber that includes an condenser side wall comprising a thermal shape-memory polymer, where the vapor core of the expandable vapor chamber is in a retracted state, according to one or more embodiments shown and described herein.
Figure 5B:
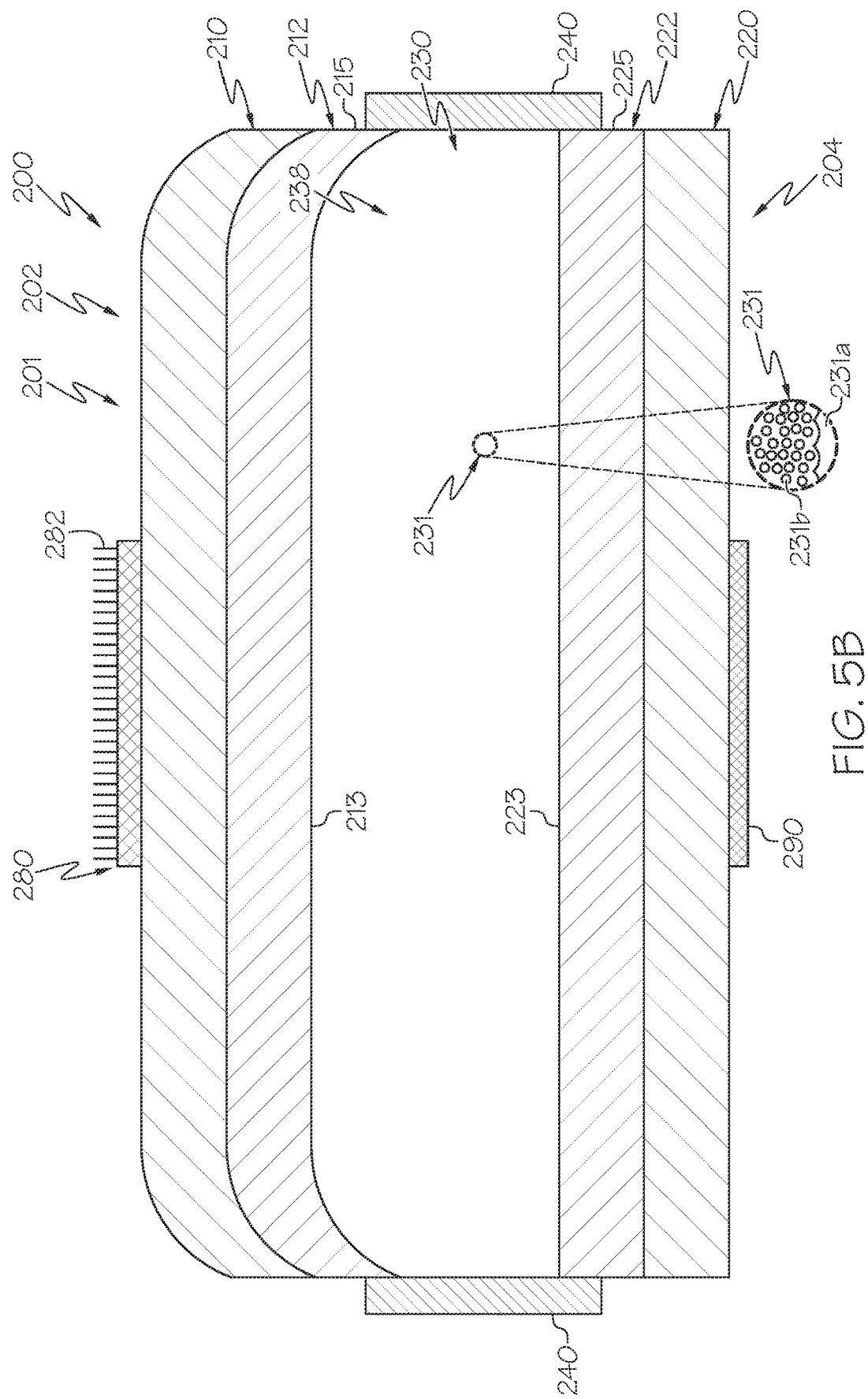
FIG. 5B schematically depicts the example cooling system of FIG. 5A in which the expandable vapor chamber that includes the condenser side wall comprising a thermal shape-memory polymer, where the vapor core of the expandable vapor chamber is in an expanded state, according to one or more embodiments shown and described herein.

Referring now to FIGS. 5A and 5B, a cooling system 200 comprising an expandable vapor chamber 201 positioned between and thermally coupled to a heat generating device 290, such as a power semiconductor device, and a heat removal device 280, such as a heat plate comprising a plurality of fins 282, is schematically depicted. Similar to the expandable vapor chamber 101 of FIGS. 1A and 1B and the expandable vapor chamber 101' of FIGS. 2A and 2B, the expandable vapor chamber 201 comprises a condenser side 202 opposite an evaporator side 204. At the condenser side 202, the expandable vapor chamber 201 comprises a condenser side wick 212 coupled to a condenser side wall 210. At the evaporator side 204, the expandable vapor chamber 201 comprises an evaporator side wick 222 coupled to an evaporator side wall 220. Further, the expandable vapor chamber 201 comprises a vapor core 230 positioned between a wicking surface 223 the evaporator side wick 222 and a wicking surface 113 of the condenser side wick 212. The vapor core 230 houses a cooling fluid 231, which may comprise any of the cooling fluids 131 described above, and may transform between a liquid phase 232a and a gas phase 231b during operation of the expandable vapor chamber 210.

The expandable vapor chamber 201 further comprises a sealing layer 240 comprising a flexible material that hermetically seals the vapor core 230. In particular, the sealing layer 240 may be coupled to the evaporator side wall 220, the evaporator side wick 222, or both, as well as the condenser side wall 210', the condenser side wick 212, or both, to hermetically seal the vapor core 230. In some embodiments, as depicted in FIGS. 5A and 5B, the sealing layer 240 extends between the evaporator side wick 222 and the condenser side wick 212 and the sealing layer 240 is coupled to a side surface 225 of the evaporator side wick 222 and a side surface 215 of the condenser side wick 212. Furthermore, while the sealing layer 240 is not depicted in contact with the evaporator side wall 220 and the condenser side wall 210 in FIGS. 5A and 5B, it should be understood that, in some embodiments, the sealing layer 240 may extend to the evaporator side wall 220 and the condenser side wall 210, and may be coupled to the evaporator side wall 220 and the condenser side wall 210.

Similar to the expandable vapor chambers 101, 101' of FIGS. 1A-2B, the vapor core 230 of the expandable vapor chamber 201 of FIGS. 3A and 3B is translatable between a retracted position 236 (FIG. 3A) and an expanded position 238 (FIG. 3B) such that the vapor core 230 has volume and thickness variability. In the embodiments of the expandable vapor chambers 101, 101' described above, the volume of the vapor core 130 is actively altered based on a vapor pressure measurement using the bellow actuator 132. However, the volume of the vapor core 230 of the expandable vapor chamber 201 of FIGS. 5A and 5B may be passively altered between the retracted position 236 and the expanded position 238. In particular, the condenser side wall 210 of the expandable vapor chamber 201 comprises a thermal shape-memory polymer. As used herein, a thermal shape-memory polymer is a polymeric material with the ability to change between an original state and a deformed state in response to a thermal stimulus.

In particular, the thermal shape-memory polymer of the condenser side wall 210 comprises a transition temperature. Without intending to be limited by theory, the crosslinks of the molecular network structure of the thermal shape-memory polymer are altered at the transition temperature, thereby altering the shape of the thermal shape-memory polymer. In operation, when the thermal shape-memory polymer of the condenser side wall 210 comprises a temperature below the transition temperature, the condenser side wall 210 remains in the retracted position 236 (e.g., its original state) and when the thermal shape-memory polymer of the condenser side wall 210 comprises a temperature above the transition temperature, the condenser side wall 210 expands (e.g., into its deformed state), expanding the vapor core 230 into the expanded position 238. The transition temperature may be in a range from 30° C. to 80° C., such as from 40° C. to 70° C., for example, 30° C., 35° C., 40° C., 45° C., 50° C., 55° C., 60° C., 65° C., 70° C., 75° C., 80° C., or the like. Example thermal shape-memory polymers include polyurethane, polyethylene terephthalate (PET), polyethyleneoxide (PEO), polystyrene and poly(1,4-butadiene), poly(2-methyl-2-oxazoline), polytetrahydrofuran, polynorbornene, and polyether ether ketone (PEEK).

It should now be understood that embodiments described herein are directed to cooling systems that include an expandable vapor chamber for cooling heat generating devices, such as power semiconductor devices. In particular, the volume and thickness of the vapor core of the expandable vapor chamber may be actively altered using a bellows actuator positioned in the vapor core and communicatively coupled to a controller or may be passively altered using a thermal shape-memory polymer. A vapor core having a variable thickness and volume reduces the likelihood of dryout and increases resiliency against packaging stress and power bursts, while maintaining a small form factor.

As used herein, the term "thermally coupled" refers to two or more components in thermal communication such that heat is transferable from the hotter component to the colder of the one or more components by one or more thermal transfer means (e.g., thermal conductivity, thermal radiation, or thermal convection).

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling system comprising:
an expandable vapor chamber comprising:
 a condenser side opposite an evaporator side;
 a condenser side wick coupled to a condenser side wall;
 an evaporator side wick coupled to an evaporator side wall; and
 a vapor core positioned between the evaporator side wick and the condenser side wick, wherein the condenser side wall comprises a thermal shape-memory polymer having a transition temperature that passively transitions the vapor chamber between a retracted position and an expanded position.

2. The cooling system of claim 1, wherein the transition temperature is in a range from 40° C. to 75° C.

3. The cooling system of claim 1, further comprising a sealing layer extending between the evaporator side wick and the condenser side wick, wherein the sealing layer comprises a flexible material and hermetically seals the vapor core.

4. The cooling system of claim 3, wherein the sealing layer is coupled to a side surface of the evaporator side wick and a side surface of the condenser side wick.

5. The cooling system of claim 1, wherein:
the condenser side wick and the evaporator side wick each comprise a wicking surface facing the vapor core; and
the wicking surface of each of the condenser side wick and the evaporator side wick comprise a plurality of nucleation sites.

6. The cooling system of claim 1, wherein:
the condenser side wick and the evaporator side wick each comprise a wicking surface facing the vapor core; and
the wicking surface of each of the condenser side wick and the evaporator side wick comprise a plurality of nucleation sites.

7. The cooling system of claim 1, wherein the thermal shape-memory polymer comprises one or more of polyurethane, polyethylene terephthalate (PET), polyethyleneoxide (PEO), polystyrene and poly(1,4-butadiene), poly(2-methyl-2-oxazoline), polytetrahydrofuran, polynorbornene, and polyether ether ketone (PEEK).

8. The cooling system of claim 1, further comprising:
a power semiconductor device thermally coupled to the evaporator side wall of the expandable vapor chamber; and
a heat removal device thermally coupled to the condenser side wall of the expandable vapor chamber; and
a cooling fluid housed within the vapor core.

9. A cooling system comprising:
an expandable vapor chamber comprising:
 a condenser side opposite an evaporator side;
 a condenser side wick coupled to a condenser side wall;
 an evaporator side wick coupled to an evaporator side wall; and
 a vapor core positioned between the evaporator side wick and the condenser side wick, wherein the condenser side wall comprises a thermal shape-memory polymer having a transition temperature such that:
  when the thermal shape-memory polymer comprises a temperature below the transition temperature, the evaporator side wall is in a retracted position and the vapor core comprises a first volume; and
  when the thermal shape-memory polymer comprises a temperature above the transition temperature, the evaporator side wall is in an expanded position and the vapor core comprises a second volume that is greater than the first volume.

10. The cooling system of claim 9, wherein the transition temperature is in a range from 40° C. to 75° C.

11. The cooling system of claim 9, further comprising a sealing layer extending between the evaporator side wick and the condenser side wick, wherein the sealing layer comprises a flexible material and hermetically seals the vapor core.

12. The cooling system of claim 11, wherein the sealing layer is coupled to a side surface of the evaporator side wick and a side surface of the condenser side wick.

13. The cooling system of claim 9, wherein:
the condenser side wick and the evaporator side wick each comprise a wicking surface facing the vapor core; and
the wicking surface of each of the condenser side wick and the evaporator side wick comprise a plurality of nucleation sites.

14. The cooling system of claim 9, wherein:
the condenser side wick and the evaporator side wick each comprise a wicking surface facing the vapor core; and
the wicking surface of each of the condenser side wick and the evaporator side wick comprise a plurality of nucleation sites.

15. The cooling system of claim 9, wherein the thermal shape-memory polymer comprises one or more of polyurethane, polyethylene terephthalate (PET), polyethyleneoxide (PEO), polystyrene and poly(1,4-butadiene), poly(2-methyl-2-oxazoline), polytetrahydrofuran, polynorbornene, and polyether ether ketone (PEEK).

16. The cooling system of claim 9, further comprising:
a power semiconductor device thermally coupled to the evaporator side wall of the expandable vapor chamber; and
a heat removal device thermally coupled to the condenser side wall of the expandable vapor chamber; and
a cooling fluid housed within the vapor core.

* * * * *